(12) United States Patent
Jung et al.

(10) Patent No.: US 6,204,191 B1
(45) Date of Patent: Mar. 20, 2001

(54) METHOD OF MANUFACTURING SEMICONDUCTOR DEVICES AND SEMICONDUCTOR DEVICE CAPACITOR MANUFACTURED THEREBY

(75) Inventors: Kwang-Jin Jung; Tae-ryong Kim, both of Suwon; Chung-howan Kim; Jae-hee Hwang, both of Yongin, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/333,932

(22) Filed: Jun. 16, 1999

(30) Foreign Application Priority Data

Jun. 23, 1998 (KR) .................................................. 98-23769

(51) Int. Cl.[7] .................... H01L 21/302; H01L 21/461; H01L 21/311; H01L 21/44
(52) U.S. Cl. .................... 438/713; 438/673; 438/701; 438/665; 438/964
(58) Field of Search .................................... 438/673, 701, 438/713, 665, 964

(56) References Cited

U.S. PATENT DOCUMENTS

| | | | | |
|---|---|---|---|---|
| 5,668,039 | * | 9/1997 | Lin | 438/387 |
| 5,989,969 | * | 11/1999 | Watanabe et al. | 438/381 |
| 6,018,173 | * | 1/2000 | Keller et al. | 257/296 |
| 6,083,803 | * | 7/2000 | Fischer et al. | 438/396 |
| 6,110,824 | * | 8/2000 | Licata et al. | 438/666 |
| 6,130,124 | * | 10/2000 | Lee | 438/240 |

OTHER PUBLICATIONS

H. Watanabe et al., "Hemispherical Grained Silicon (HSG–Si) Formation on In–Situ Phosphorous Doped Amorphous–Si Using The Seeding Method", Extended Abstracts of the 1992 International Conference on Solid State Devices and Materials, Tsukuda, 1992, pp. 422–424.

* cited by examiner

Primary Examiner—John F. Niebling
Assistant Examiner—Jennifer M. Kennedy
(74) Attorney, Agent, or Firm—Jones Volentine, L.L.C.

(57) ABSTRACT

A method of manufacturing semiconductor device that improves the alignment margin between a contact hole and a device pattern includes a layer having an upper vertically shaped portion and a lower symmetrically inclined shaped portion. That is, the lower portion is tapered.

20 Claims, 9 Drawing Sheets

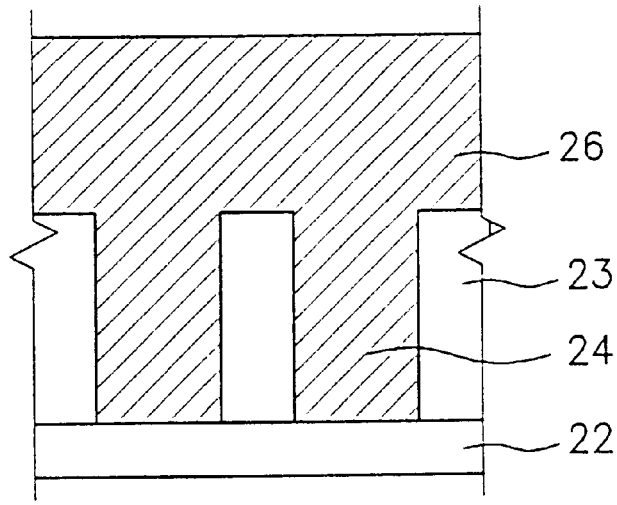
FIG. 6
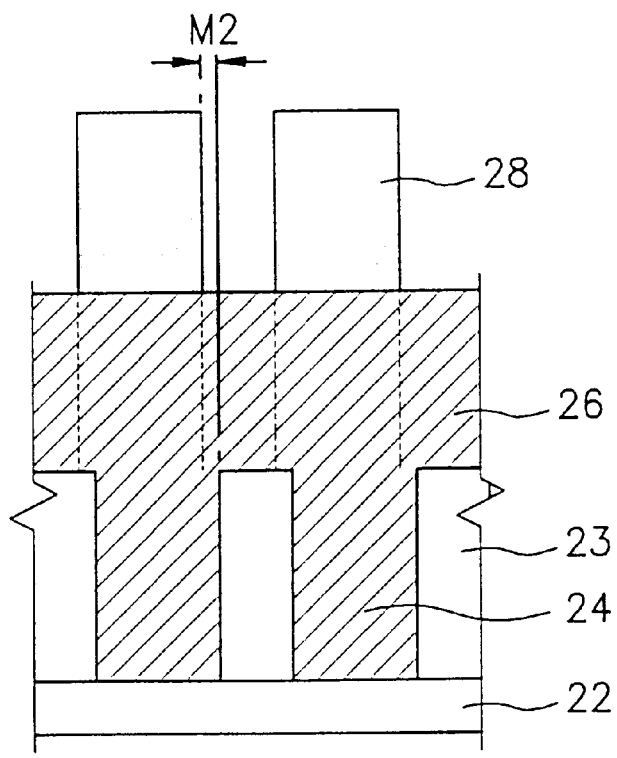

METHOD OF MANUFACTURING SEMICONDUCTOR DEVICES AND SEMICONDUCTOR DEVICE CAPACITOR MANUFACTURED THEREBY

BACKGROUND OF THE INVENTION

1. Field of the Invention

The present invention relates to a method of manufacturing a semiconductor device capacitor, and more particularly, to a method of manufacturing a semiconductor device capacitor having an improved alignment margin and capacitance.

2. Description of the Related Art

The demand for increased integration of semiconductor devices typically requires an increase in the capacitance of semiconductor capacitors incorporated in the devices. As a result, the structure of semiconductor capacitors is becoming more complicated.

In semiconductor memory devices, one unit cell of Dynamic Random Access Memory (DRAM) comprises a single capacitor and a single transistor. The demand for increased integration of semiconductor devices dictates that the capacitance of the capacitor increases while the size of the unit cell decreases. Even if the area of a capacitor is decreased, the capacitor must continue to have a capacitance sufficient to store adequate charge. However, decreasing the area of the capacitor tends to decrease the area of the storage electrode, which causes problems in the limit of the alignment margin between the storage electrode and the contact holes under the storage electrode.

One way to address the difficulty associated with decreasing alignment margins, is to reduce the size of the contact holes instead of reducing critical dimensions for the pattern used to form the storage electrode. However, due to limitations in current photo-lithography process technology, it is very difficult to decrease the size of the contact holes.

FIGS. 1 and 2 are cross-sectional views illustrating problems associated with a conventional method of manufacturing a semiconductor capacitor. Referring to FIG. 1, a polysilicon layer 12 for the storage electrode is formed on the semiconductor substrate 2 having a lower structure 4 of a nitride film 6, an oxide film 8, and a bit line 5. A photoresist pattern 14 for the formation of the storage electrode is formed by a typical photo-lithography process. More particularly, contact holes 10 are first formed over the semiconductor substrate 2 including the lower structure 4 of nitride film 6, oxide film 8, and bit line 5 by a photo-etch process, and polysilicon layer 12 is formed by Low Pressure Chemical Vapor Deposition (LPCVD), thus burying contact holes 10.

Photoresist is then coated on the polysilicon layer 12 and a photoresist pattern 14 is formed by using a photo-lithography process.

As described above, with highly-integrated DRAM devices, the critical dimensions of photoresist pattern 14 for the formation of the storage electrode of the capacitor are becoming smaller, decreasing the alignment margin of photoresist pattern 14 and contact holes 10. In the formation process for the capacitor, the alignment of photoresist pattern 14 for the formation of the storage electrode and contact holes 10 is an important factor and is closely related to the capacitance of the capacitor. Therefore, after forming photoresist pattern 14, the alignment state of photoresist pattern 14 and contact hole 10 is measured using an alignment measuring device. Based on the extent of measured misaligned values, photoresist pattern 14 on semiconductor substrate 2 may be removed, and another photo-lithography process performed for the formation of photoresist pattern 14. Alternatively, if the misaligned values are acceptable, the next step in the device formation may be carried out.

As shown in FIG. 1, the misalignment (M1) between the photoresist pattern 14 and the contact holes 10 continuously affects the etch process for the polysilicon layer 12, thereby causing misalignment (M1) between the contact holes 10 and the storage electrode formed after the etch process for the polysilicon layer 12.

FIG. 2 is a cross-sectional view showing storage electrodes 12a, 12b, and 12c formed by the etch process for the polysilicon layer 12 using the photoresist pattern 14 as an etch mask. The etch process is carried out in an etch chamber. Storage electrodes 12a, 12b, and 12c are formed by a dry etching process using the photoresist pattern 14 as an etch mask.

The storage electrodes 12a, 12b, and 12c store their information based on charge transferred from the source region of the transistor through the contact holes 10. Oxide film 8 contained in the lower structure 4 of the semiconductor substrate 2 is used as an intermediate insulating layer. It should be apparent to those skilled in the art that the shapes and the structure of the storage electrodes 12a, 12b, 12c can be altered.

FIG. 3 is a cross-sectional view of FIG. 2 taken along the line III–III'. As shown in FIG. 2 and FIG. 3, when the etch process generates misalignment (M1) between contact holes 10 and photoresist pattern 14, the polysilicon layer 12 inside the contact holes 10 is exposed to etch gas proportional to the misalignment (M1) of the contact holes 10 and the storage electrode 12c. Etching of the exposed polysilicon layer forms empty holes 18 within the contact holes 10. An empty hole 18 increases the contact resistance of the storage electrode, increasing the likelihood of the storage electrode breaking and decreasing the reflash characteristics of the capacitor.

Therefore, there is a need in the art to overcome the above problem with the photo-lithography process and, in particular, to solve the misalignment problem between the storage electrode and the contact holes.

SUMMARY OF THE INVENTION

The present invention provides an improved semiconductor capacitor which overcomes one or more limitations or disadvantages of the related art.

One method consistent with the present invention for manufacturing a semiconductor device comprises forming contact holes in an insulating film formed over a semiconductor substrate; forming a conductive film on the insulating film, the conductive film burying the contact holes; forming a photoresist pattern on the conductive film; vertically etching a first portion of the conductive film using the photoresist pattern as an etch mask; and obliquely etching the remaining portion of the conductive film to form a tapered portion, a lower end of the tapered portion being wider than an upper end of the tapered portion, and the lower end of the tapered portion covering the contact holes.

A second related method of manufacturing a semiconductor device consistent with the present invention comprises forming a contact hole in an insulating layer formed over a semiconductor substrate; forming a polysilicon layer on the insulating layer, the polysilicon layer burying the contact hole; forming a photoresist pattern on the polysilicon layer; forming a charge storage electrode by vertically etching a first portion of the polysilicon layer using the photoresist pattern as an etch mask, and obliquely etching a second portion of the polysilicon layer to form a tapered portion, a lower end of the tapered portion being wider than an upper end of the tapered portion and the lower end of the tapered portion covering the contact hole; forming a dielectric layer on the storage electrode; and forming a plate electrode on the dielectric layer.

A semiconductor capacitor consistent with the present inventions comprises a number of elements, including: a semiconductor substrate; a lower structure formed to contain contact holes formed on the semiconductor substrate; a storage electrode formed on the lower structure within the contact holes, the storage electrode including an upper vertically shaped portion and a lower obliquely shaped portion, the bottom of the obliquely shaped portion being in contact with the top of the lower structure; a dielectric layer formed on the storage electrode; and a plate electrode formed on the dielectric layer.

BRIEF DESCRIPTION OF THE DRAWINGS

In the accompanying drawings:

FIGS. 5, 6, 7 and 8 are cross-sectional views showing the process sequences of FIG. 4;

DETAILED DESCRIPTION OF THE PREFERRED EMBODIMENTS

Reference will now be made in detail to the preferred embodiments of the present invention, examples of which are illustrated in the accompanying drawings.

Figure 1:
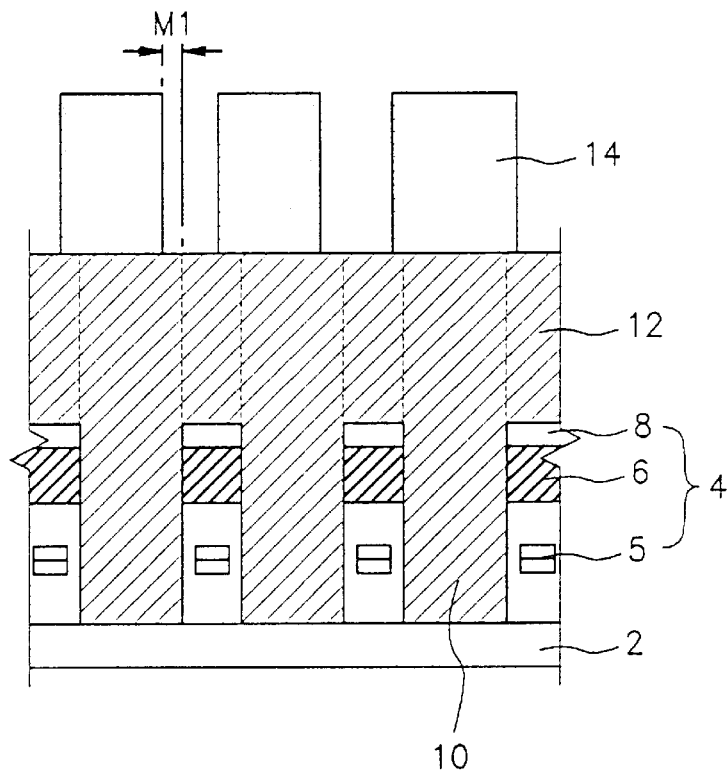
FIG. 1 and FIG. 2 are cross-sectional views showing problems occurring in the formation of a conventional capacitor.
Figure 2:
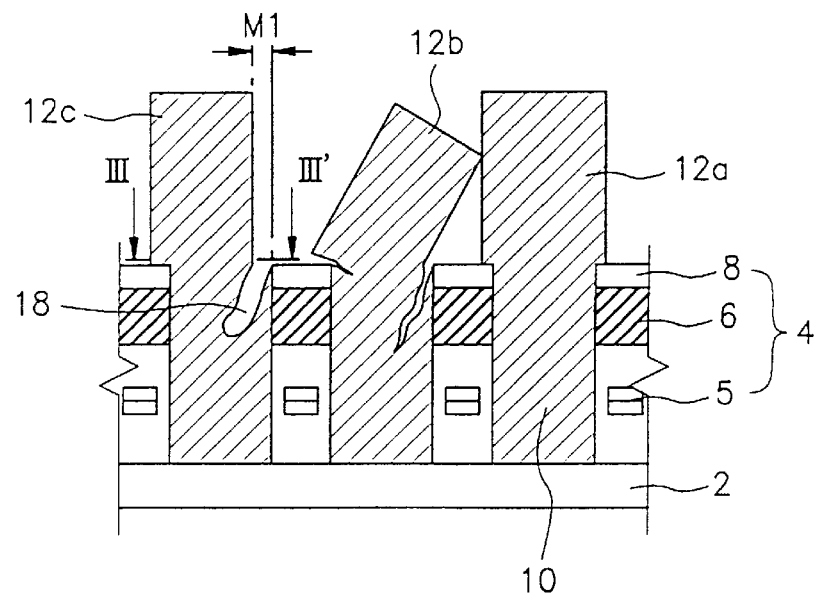
Figure 3:
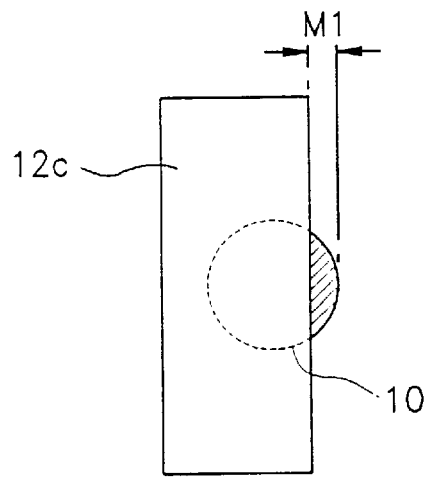
FIG. 3 is a cross-sectional view of the FIG. 2 taken along the line III—III'.
Figure 4:
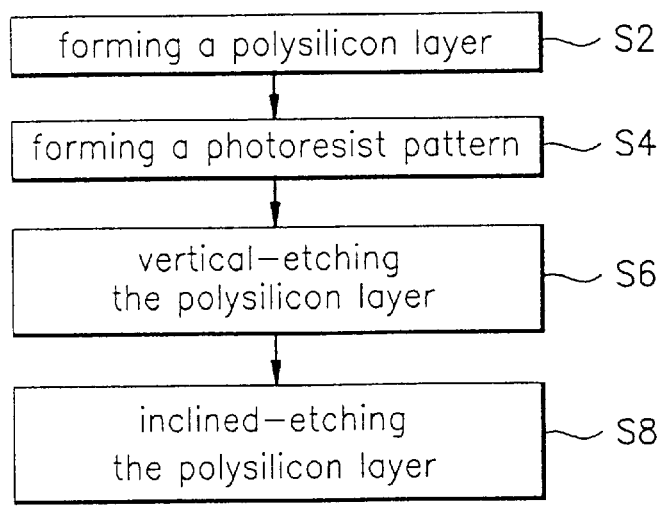
FIG. 4 is a low chart illustrating a method of manufacturing semiconductor devices according to one embodiment of the present invention.

FIGS. 4–8 are diagrams illustrating a first embodiment consistent with the present invention. FIG. 4 is a flow chart illustrating a process for manufacturing semiconductor devices, and FIGS. 5 to 8 are cross-sectional views respectively illustrating the process sequence of FIG. 4.

In step S2, a polysilicon layer 26 is formed as a conductive film on a semiconductor substrate 22 (see FIG. 5). An insulating film 23 and a plurality of contact holes 24 with a certain depth are also formed. Polysilicon layer 26 is formed over the insulating film 23 with a thickness large enough to bury contact holes 24.

Step S4 includes forming a photoresist pattern 28 over polysilicon layer 26 as shown in FIG. 6. The photoresist pattern 28 is used to form a conductive film pattern on the contact hole 24. That is, typically the photoresist pattern 28 is formed by coating the photoresist on the polysilicon layer 26, aligning a photo mask having a desired pattern formed thereon, and then carrying out exposure and development. Ideally, the photoresist pattern 28 should be exactly aligned with the contact holes 24, but as previously mentioned, the recent trend towards highly-integrated and sophisticated semiconductor devices means misalignment (M2) often occurs.

Figure 7:
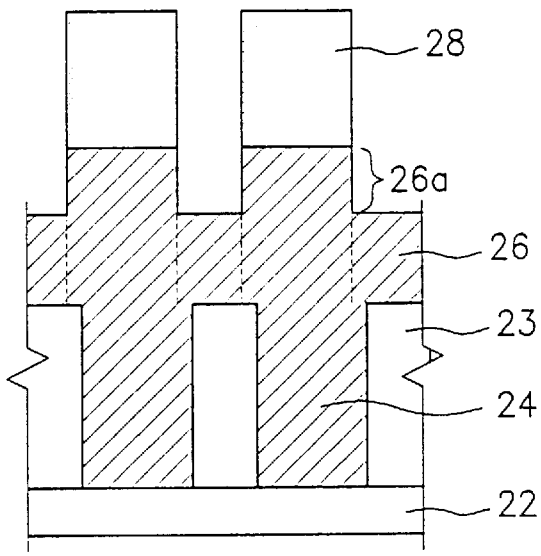

Step S6 includes vertically etching the polysilicon layer 26 to a predetermined thickness using the photoresist pattern 28 as an etch mask as shown in FIG. 7. The thickness of vertical pattern 26a of the polysilicon layer 26 may be between 20% and 70% of the initial thickness of the polysilicon layer 26, and preferably, is between 40% to 50% of the initial thickness of the polysilicon layer 26. The etch gas used in the vertical-etch is a mixed gas of $Cl_2$, $SF_6$, and $N_2$. The flow amount of the etch gas in the vertical-etch is in the range $Cl_2$: 10 to 30 sccm, $SF_6$: 3 to 7 sccm, and $N_2$: 3 to 7 sccm. Preferably, $Cl_2$ is 20 sccm, SF6 5 sccm, and $N_2$ is 5 sccm. The process time for the vertical etch varies according to the thickness of the remaining portion of the polysilicon layer 26, and also depends on the process conditions.

Figure 8:
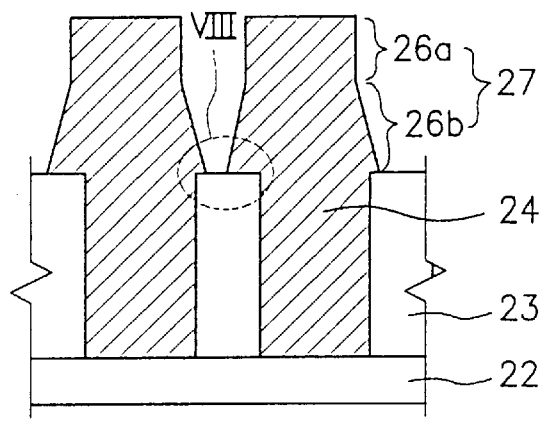

Step S8 involves etching polysilicon layer 26 on an incline. Referring to FIG. 8, after vertical-etching the polysilicon layer 26 to a predetermined thickness using the photoresist pattern 28 as an etch mask as described above, an oblique (inclined) etch pattern 26b is formed by etching the remaining portion of the polysilicon layer 26 in a tapered shape such that the dimension of the lower side of the obliquely etched portion of the polysilicon layer is larger than that of the vertically etched portion. The etch gas used in the inclined-etch for the polysilicon layer 26 is a mixed gas of $Cl_2$ and $N_2$. The flow amount of the etch gas in the inclined-etch is in the range: $Cl_2$, 150 to 250 sccm and $N_2$, 3 to 7 sccm. Preferably, $Cl_2$ is 200 sccm and $N_2$ is 5 sccm. The process time for the inclined-etch varies according to the thickness of the remaining portion of the polysilicon layer 26 and other process conditions.

The exact amount to etch in the inclined-etch step is very important in the lower portion of the polysilicon layer 26. In view of this, an end point detector (EPD) is used and over etch is employed. The EPD is used when controlling a layer portion to be etched, and the small amount of the portion of the polysilicon layer 26, which directly contacts with its sub-layer, is removed by the over etch method. As a result of the vertical etch and the inclined etch described above, the misalignment (M2), which occurred between the contact hole 24 and the photoresist pattern 28 in the prior art, does not occur between the contact hole 24 and the polysilicon layer pattern 27, as shown in the circled portion VIII of FIG. 8.

Additionally, the step of measuring the misalignment, which was required in the conventional photo-lithography process, can be omitted, thereby increasing productivity.

A second embodiment consistent with the present invention will now be described with reference to the seven-step flow chart of FIG. 9 and schematic device views shown in FIGS. 10–17.

Figure 9:
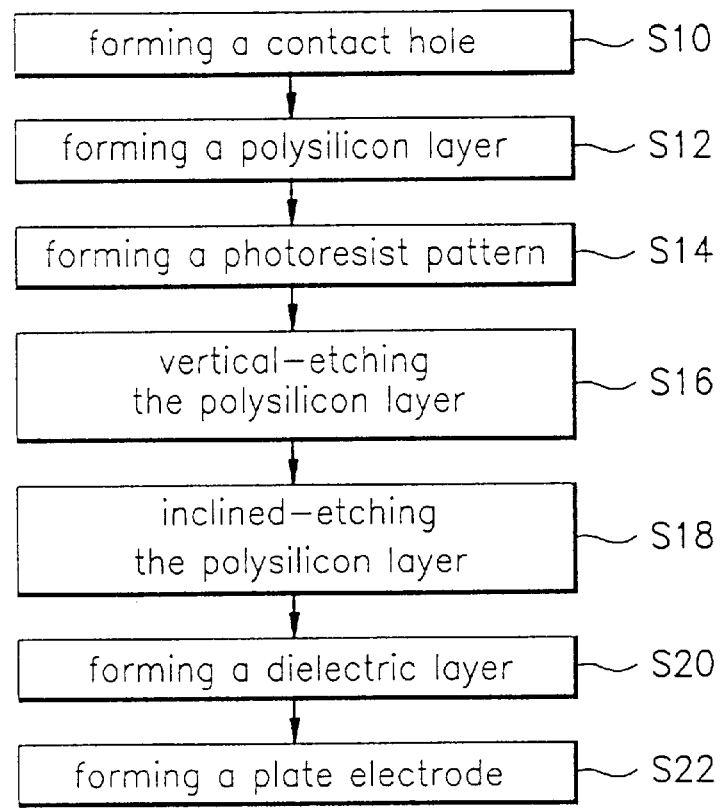
FIG. 9 illustrates a process of forming a capacitor according to the method of manufacturing semiconductor devices of the present invention.
Figure 10:
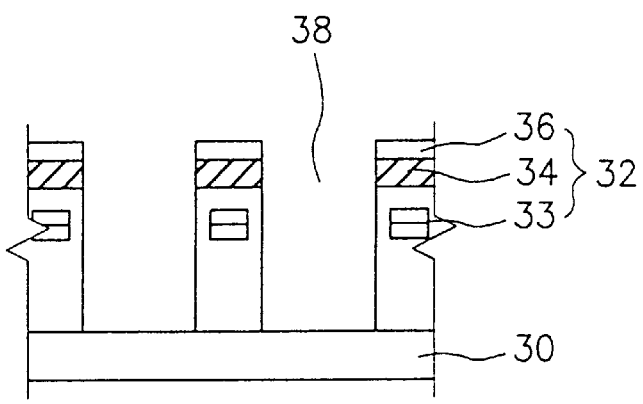
FIGS. 10, 11, 12, 13, 14, 15, 16 and 17 are cross-sectional views illustrating stages in the process sequences of FIG. 9.

FIG. 9 is a flow chart illustrating a process for manufacturing a semiconductor device capacitor. A contact hole 38 is formed over a semiconductor substrate 30 having a lower structure 32 already formed thereon (step S10). Referring to FIG. 10, an insulating layer 34 and an oxide film 36 are formed over semiconductor substrate 30 having a bit line 33 formed thereon. The bit line contacts a drain portion (not shown) of a transistor. Photoresist is coated on the semiconductor substrate 30 in order to expose portions of the semiconductor substrate 30. Then, a photoresist pattern is formed by exposure and development, and contact holes 38 are formed by an etch process.

The trend to highly-integrated semiconductor devices leads to an increasing depth of contact hole 38. However, the deeper the depth of the contact hole the more difficult it becomes to achieve a desired pattern profile. Cell pads (not shown), marked on the lower portion of the contact hole 38, are used to control the actual depth of the contact hole 38.

Figure 11:
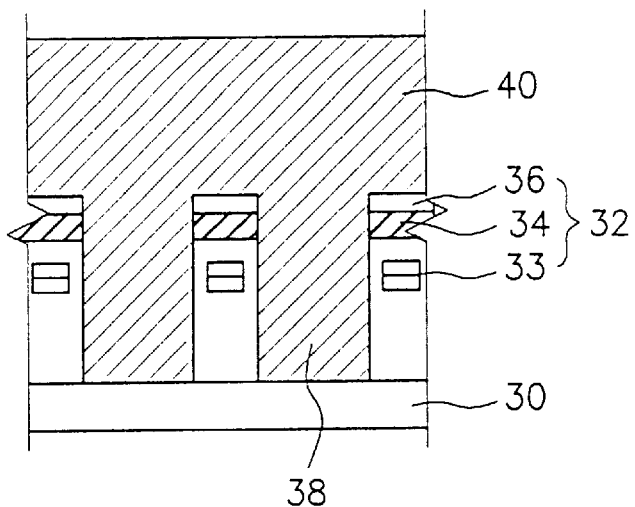

An amorphous polysilicon layer (a-Si) 40 is formed on the contact hole 38 (step S12). Referring to FIG. 11, amorphous silicon layer (a-Si) 40 is shown burying the contact hole 38. Layer 40 is used in the formation of a storage electrode. The thickness of the amorphous silicon layer (a-Si) 40 may be between 800 to 1000 nm, and is preferably 900 nm. The thickness of the amorphous silicon layer 40 may be different depending on device characteristics.

Amorphous silicon layer 40 is formed using a mixed gas of a silicon (Si)-containing gas such as silane ($SiH_4$) or disilane ($Si_2H_6$) and a phosphorus (P)-containing gas such as phosphine ($PH_3$) as a process gas. That is, the disilane gas and the phosphine gas are introduced into a process chamber, pyrolyzed, and deposited over the semiconductor substrate 30, burying the contact holes 38 by way of a Low Pressure Chemical Vapour Deposition (LPCVD) process, thereby forming the amorphous silicon layer 40 having phosphorus as an impurity. The process temperature is between 500° C. to 530° C.

Figure 12:
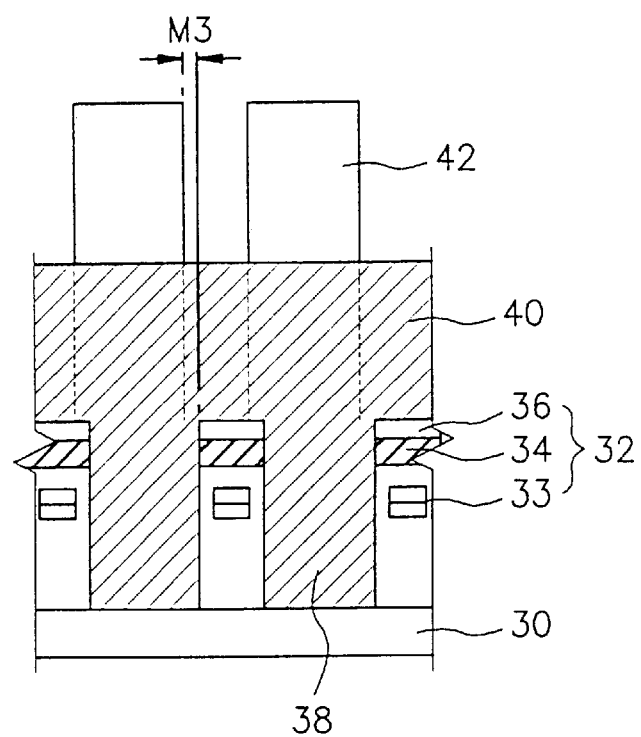

In step S14, a photoresist pattern is formed on amorphous silicon layer 40. Referring to FIG. 12, a predetermined thickness of photoresist is coated on the amorphous silicon layer 40, and by a photo process, a photoresist pattern 42 used in patterning the amorphous silicon layer 40 on contact hole 38 is formed.

Misalignment (M3), which may occur between the photoresist pattern 42 and the contact hole 38, continuously affects the process, and therefore, after the amorphous silicon layer 40 is etched, there may still exist misalignment (M3) between the contact hole 38 and the pattern of the amorphous silicon layer 40 used for the storage electrode.

That is, if an etch process is carried out while there is misalignment (M3) between the photoresist pattern 42 and the contact hole 38, the amorphous silicon layer 40 inside the contact hole 38 may be etched, thereby reducing the capacitance of the capacitor, breaking the storage electrode, and providing sources of process failures.

Figure 13:
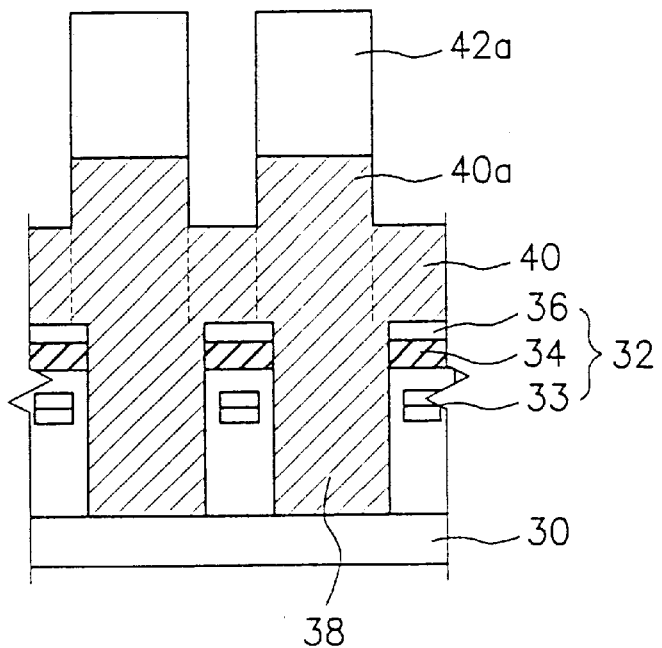

Step S 16 includes vertically etching the amorphous silicon layer 40 by a predetermined thickness. Referring to FIG. 13, the amorphous silicon layer 40 is vertically etched using the photoresist pattern 42 as an etch mask, thereby forming a vertical storage electrode 40a. The thickness of the vertically etched portion of the amorphous silicon layer 40 may be between 160 to 700 nm, and preferably, is 320 to 500 nm. In the illustrated embodiment the thickness of the vertical-etched portion of the amorphous silicon layer 40 is 400 nm. That is, the thickness of the vertical-storage electrode 40a is between 20 to 70% of the initial thickness of the amorphous polysilicon layer 40. The etch gas used in the vertical-etch is a mixed gas of $Cl_2$, $SF_6$, and $N_2$, and the flow amount of the etch gas during the vertical-etch is: $Cl_2$, 10 to 30 sccm; $SF_6$, 3 to 7 sccm; and $N_2$, 3 to 7 sccm. Preferably, $Cl_2$ is 20 sccm, $SF_6$ is 5 sccm, and $N_2$ is 5 sccm.

The process time for the vertical etch may vary according to the thickness of the amorphous silicon layer 40. Process conditions may also affect the process time. Preferably, the process time is between 50 to 100 seconds, and in the illustrated embodiment, it is 60 seconds. The thickness of the photoresist pattern 42 is reduced by the vertical etch and is shown as a second photoresist pattern 42a having a reduced thickness.

Figure 14:
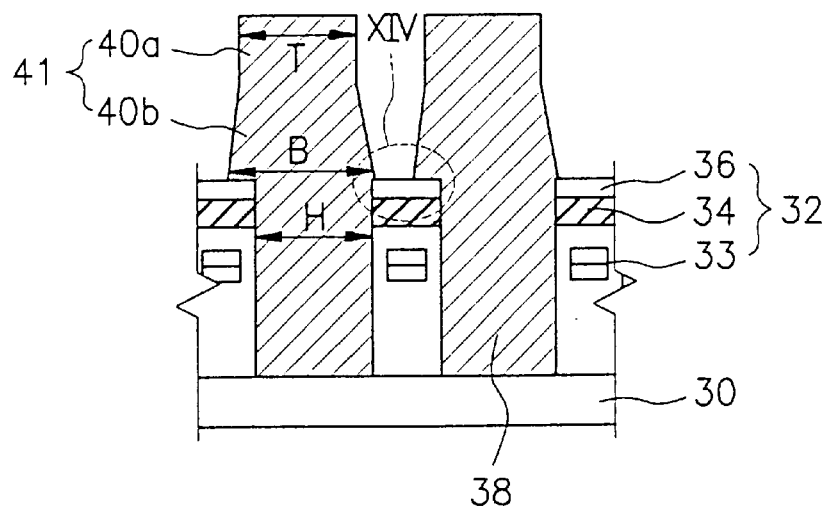

Step S18 includes etching amorphous silicon layer 40 at an incline. Referring to FIG. 14, after vertically etching the amorphous silicon layer 40, the remaining portion of the amorphous silicon layer 40 is obliquely etched to a tapered shape using the second photoresist pattern 42a as an etch mask such that the critical dimension (B) of the lower portion of the storage electrode 41 is larger than the critical dimension (T) of the vertically etched portion, thereby forming an inclined storage electrode 40b.

The storage electrode 41 is electrically coupled with a source region (not shown) through contact hole 38 and stores the charge transmitted from the source region.

The etch gas used in the inclined etch is a mixed gas of $Cl_2$ and $N_2$. The flow amount of the etch gas during the inclined-etch is: $Cl_2$ 150 to 250 sccm; and $N_2$, 3 to 7 sccm. For example, $Cl_2$ may be 200 sccm and $N_2$ may be 5 sccm.

In the inclined-etch for the remaining portion of the amorphous silicon layer 40, an EPD and over etch method is employed. The process time for the over etch varies according to the remaining thickness of the amorphous silicon layer 40. Preferably, it may be 80 to 100 seconds. In the illustrated embodiment it is 90 seconds.

By inclining the lower portion of the storage electrode 41, the surface area of the storage electrode 41 is increased and the capacitance of the capacitor can be increased. Further, because the critical dimension (B) of the inclined-storage electrode 40b is larger than the critical dimension (T) of the vertical-storage electrode 40a, misalignment (M3) does not cause amorphous silicon layer 40 inside the contact hole 38 to be undesirably etched unlike the conventional situation. This is because the critical dimension (B) of the inclined-storage electrode 40b is sufficiently larger than the critical dimension (H) of the contact hole 38.

When obliquely etching the lower portion of the amorphous silicon layer 40, care must be taken so that the space between the storage electrodes 41 does not become so small that the storage electrodes 41 contact each other. This area is shown referring to the circled portion XIV of FIG. 14.

Figure 15:
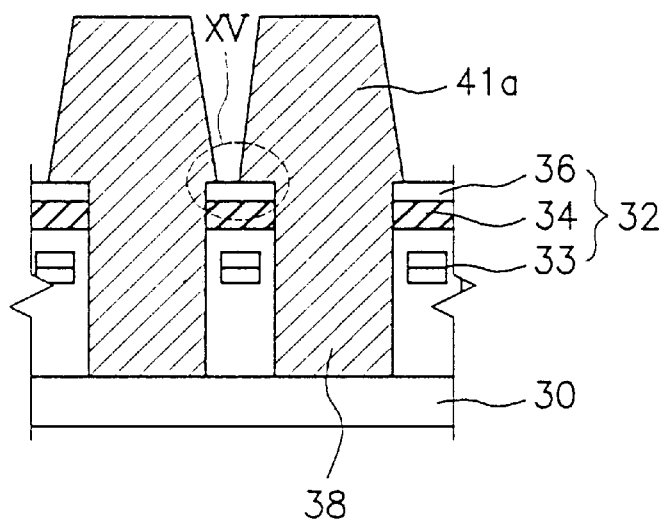

However, as shown in FIG. 15, if one is obliquely etching the whole portion of the amorphous silicon layer 40, the space between the storage electrodes 41 can be small enough such that the storage electrodes 41 contact each other. This area is shown referring to the circled portion XV of FIG. 15.

Table 1 relates alignment margin and the space between storage electrode 41 for various manufacturing parameters (cases). In Table I, the thickness of the storage electrode 41 is 900 nm, the pitch is 520 nm, the space between the storage electrodes is 240 nm, and the critical dimension of the contact hole is 280 nm.

TABLE I

| cases | storage electrode lower critical dimension (B) (nm) | storage electrode space (nm) | contact hole critical dimension (H) (nm) | Alignment margin (nm) |
|---|---|---|---|---|
| 1 | 280 | 240 | 280 | 0.0 |
| 2 | 300 | 215 | 280 | 10 |
| 3 | 320 | 200 | 280 | 20 |
| 4 | 330 | 185 | 280 | 25 |
| 5 | 340 | 180 | 280 | 30 |

In case 1, a vertical etch is carried out for the entire portion of the storage electrode 41. In case 2, the vertical etch is carried out for the portion of the storage electrode 41 from the top to 600 nm, and the remaining portion is obliquely etched. In case 3, the vertical etch is carried out for the portion of the storage electrode 41 from the top to 400 nm, and remaining portion is obliquely etched. In case 4, the vertical etch is carried out for the portion of the storage electrode 41 from the top to 200 nm, and remaining portion is obliquely etched. In case 5, an oblique etch is carried out for the entire portion of the storage electrode 41.

As the results in Table I indicate, increasing the size of the inclined-etched storage electrode 41 (dimension B) results in an increase in the alignment margin, but as shown in the circled portion XV of FIG. 15, the space between electrodes 41 is small enough so that the storage electrodes 41 can be connected to each other. Therefore, case 3 is preferable in terms of having sufficient alignment margin and space.

Figure 16:
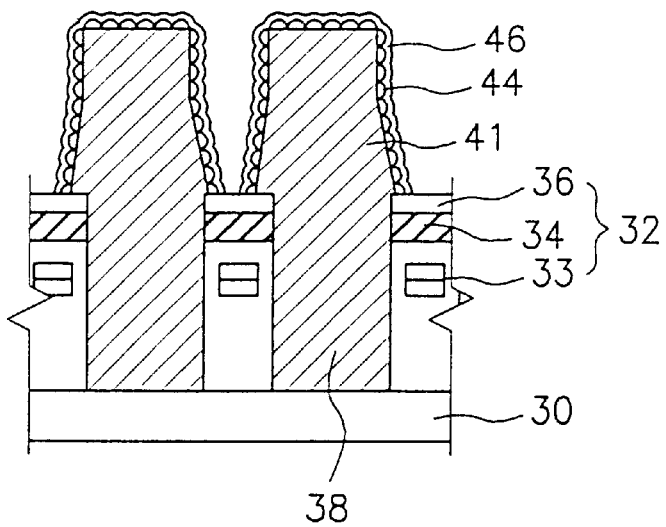

In step S20, a dielectric layer 46 is formed on the storage electrode 41. Referring to FIG. 16, a Hemispherical Grains (HSG) layer 44 having a rough surface is formed on the storage electrode 41, and a dielectric layer 46 is formed.

The use of the HSG on the storage electrode has been discussed by H. Watanabe et al., "Hemispherical Grained Silicon (HSG-Si) Formation on In-Situ Phosphorous Doped Amorphous-Si Using The Seeding Method," Solid State Devices and Materials (1992), pp. 422–424. As discussed in this reference, silicon forms hemispherical-shaped regions having a very stable surface energy state due to silicon migration in the transition temperature range of crystalline silicon and amorphous silicon.

The HSG layer 44 has a surface area two or three times as large as that of a flat surface. The HSG layer 44 is formed using LPCVD. That is, it is formed by introducing surface active silicic gas such as $Si_2H_6$ or $SiH_4$ having surface reaction with a process chamber set at 550° C. and 1 Torr so as to form a nucleus on the surface of the storage electrode 41. Thermal-treating is preformed so that hemispherical-shaped HSG layer 44 having a rough surface is formed by the thermal migration of the nucleus. The formation of the HSG layer 44 increases the capacitance of the capacitor by a factor of two.

A nitride film is formed on the surface of the HSG layer 44 in a typical manner using disilane ($Si_2H_6$) or ammonia gas ($NH_3$), and by oxidizing the surface of the nitride film, a nitride/oxide (NO)-dielectric layer 46 is formed. The dielectric layer 46 is formed using methods know in the art.

Figure 17:
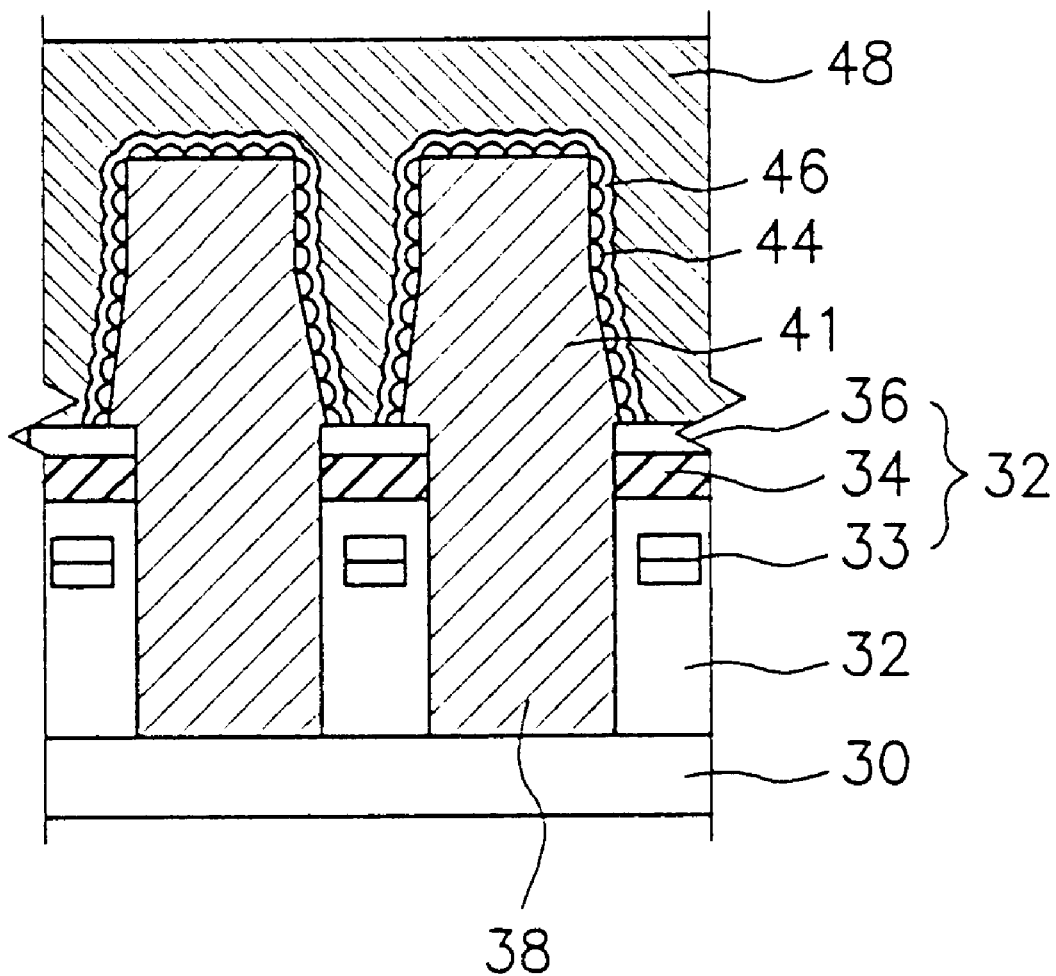

In step S22, a plate electrode is formed on the dielectric layer 46. Referring to FIG. 17, the plate electrode 48 is formed by depositing a polysilicon layer on the dielectric layer 46 to thereby complete the capacitor of the semiconductor devices.

The capacitor formed by a method of manufacturing a semiconductor device capacitor consistent with the present invention comprises a lower structure 32 having a contact hole 38 formed on a semiconductor substrate 30, and a storage electrode 41 formed on the lower structure 32 burying the contact hole 38. The storage electrode is inclined from the top of the contact hole 38 to a certain height, and it extends vertically from the upper part of the inclined-portion to the top of the storage electrode 41. A HSG layer 44 is formed on the storage electrode 41. A dielectric layer 46 and a plate electrode 48 are formed above the HSG layer 44. Accordingly, the alignment margin may be improved and the capacitance of the capacitor increased.

Morever, in the conventional method, after the typical photo-lithography process, overlay between a contact hole and a device pattern such as the storage electrode of the capacitor is measured, and if the alignment value between the contact hole and the device pattern is within a process specification, the process continues, but if the alignment value between the contact hole and the device pattern is beyond the process specification, the process must be carried out again. However, consistent with the present invention, the lower portion of the device pattern is obliquely etched symmetrically so that the alignment margin between the contact hole and the device pattern is improved, and therefore, the process efficiency is greatly improved by omitting the measurement of the overlay.

In the accompanying drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of manufacturing a semiconductor device comprising:
   a) forming contact holes in an insulating film formed over a semiconductor substrate;
   b) forming a conductive film on the insulating film, the conductive film burying the contact holes;
   c) forming a photoresist pattern on the conductive film;
   d) vertically etching a first portion of the conductive film using the photoresist pattern as an etch mask; and
   e) obliquely etching the remaining portion of the conductive film to form a tapered portion, a lower end of the tapered portion being wider than an upper end of the tapered portion, and the lower end of the tapered portion covering the contact holes, an upper end of the tapered portion having substantially a same width as a corresponding contact hole.

2. The method of manufacturing the semiconductor device of claim 1, wherein the conductive film comprises one of a polysilicon layer and an amorphous silicon layer.

3. The method of manufacturing the semiconductor device of claim 1, wherein the thickness of the vertically etched first portion of the conductive film is between 20% to 70% of the initial thickness of the conductive film.

4. The method of manufacturing the semiconductor device of claim 1, wherein a gas used in vertically etching the conductive film is a mixed gas of $Cl_2$, $SF_6$, and $N_2$.

5. The method of manufacturing the semiconductor device of claim 4, wherein the flow amount of the gas used when vertically etching comprises $Cl_2$ in the range of 10 to 30 sccm, $SF_6$ in the range of 3 to 7 sccm, and $N_2$ in the range of 3 to 7 sccm.

6. The method of manufacturing the semiconductor device of claim 1, wherein a gas used when obliquely etching is a mixed gas of $Cl_2$ and $N_2$.

7. The method of manufacturing the semiconductor device of claim 6, wherein the flow amount of gas used when obliquely etching is $Cl_2$ in the range of 150 to 250 sccm and $N_2$ in the range of 3 to 7 sccm.

8. The method of manufacturing the semiconductor device of claim 1, wherein the step of obliquely etching employs an end point detector (EPD) and over etch.

9. A method of manufacturing a semiconductor device comprising:
   a) forming a contact hole in an insulating layer formed over a semiconductor substrate;
   b) forming a polysilicon layer on the insulating layer, the polysilicon layer burying the contact hole;
   c) forming a photoresist pattern on the polysilicon layer;
   d) forming a charge storage electrode by vertically etching a first portion of the polysilicon layer using the photoresist pattern as an etch mask, and obliquely etching a second portion of the polysilicon layer to form a tapered portion, a lower end of the tapered portion being wider than an upper end of the tapered portion and the lower end of the tapered portion covering the contact hole, said vertically etching creating an upper end of the tapered portion having substantially a same width as a corresponding contact hole;

e) forming a dielectric layer on the storage electrode; and f) forming a plate electrode on the dielectric layer.

10. The method of manufacturing the semiconductor device of claim 9, wherein the thickness of the polysilicon layer is between 800 to 1000 nm.

11. The method of manufacturing the semiconductor device of claim 10, wherein the thickness of the first portion of the polysilicon layer is between 160 to 700 nm.

12. The method of manufacturing the semiconductor device of claim 11, wherein a gas used when vertically etching the polysilicon layer is a mixed gas of $Cl_2$, $SF_6$, and $N_2$.

13. The method of manufacturing the semiconductor device of claim 12, wherein the flow amount of the gas used when vertically etching includes $Cl_2$ in the range of 10 to 30 sccm, $SF_6$ in the range of 3 to 7 sccm, and $N_2$ in the range of 3 to 7 sccm.

14. The method of manufacturing the semiconductor device of claim 9, wherein a gas used when obliquely etching the polysilicon layer is a mixed gas of $Cl_2$ and $N_2$.

15. The method of manufacturing the semiconductor device of claim 14, wherein the flow amount of the gas used when obliquely etching includes $Cl_2$ in the range of 150 to 250 sccm and $N_2$ in the range of 3 to 7 sccm.

16. The method of manufacturing the semiconductor device of claim 9, wherein performing the step of obliquely etching employs an end point detector (EPD) and over etch.

17. The method of manufacturing semiconductor devices of claim 9, wherein a Hemispherical Grains (HSG) layer is formed on the surface of the storage electrode.

18. A method of manufacturing a semiconductor device comprising:

a) forming contact holes in an insulating film formed over a semiconductor substrate;

b) forming a conductive film on the insulating film, the conductive film burying the contact holes;

c) forming a photoresist pattern on the conductive film; and d) obliquely etching the conductive film without a substantial vertical etch, including a top portion thereof to form a tapered portion, a lower end of the tapered portion being wider than an upper end of the tapered portion, and the lower end of the tapered portion covering the contact holes.

19. The method of manufacturing a semiconductor device of claim 18, wherein, after said obliquely etching, an upper end of the tapered portion having substantially a same width as a corresponding contact hole.

20. The method of manufacturing a semiconductor device of claim 18, wherein said obliquely etching uses a same etching gas throughout.

* * * * *